United States Patent [19]
Semkow et al.

[11] Patent Number: 6,060,176
[45] Date of Patent: May 9, 2000

[54] CORROSION PROTECTION FOR METALLIC FEATURES

[75] Inventors: Krystyna W. Semkow, Poughquag; Eugene J. O'Sullivan, Nyack, both of N.Y.

[73] Assignee: International Business Machines Corporation, Armonk, N.Y.

[21] Appl. No.: 08/936,750

[22] Filed: Sep. 25, 1997

Related U.S. Application Data

[63] Continuation-in-part of application No. 08/815,337, Mar. 11, 1997, Pat. No. 5,846,598, which is a continuation of application No. 08/565,602, Nov. 30, 1995, abandoned.

[51] Int. Cl.[7] .............................. B32B 3/00; H01L 29/12
[52] U.S. Cl. ..................... 428/620; 428/209; 428/623; 428/626; 428/668; 428/670; 428/680; 428/699; 428/936; 257/758; 257/762; 257/766
[58] Field of Search .................... 428/209, 210, 428/620, 623, 626, 674, 675, 668, 699, 901, 473.5, 670, 680, 936; 257/758, 759, 762, 766; 427/304, 305, 306; 106/1.21, 1.23, 1.24

[56] References Cited

U.S. PATENT DOCUMENTS

| | | | |
|---|---|---|---|
| 2,532,283 | 12/1950 | Brenner | 117/50 |
| 2,884,344 | 4/1959 | Ramirez | 117/130 |
| 2,994,369 | 8/1961 | Carlin | 159/47 |
| 3,672,940 | 6/1972 | Funada et al. | 117/47 A |
| 4,072,781 | 2/1978 | Shirahata | 428/336 |
| 4,169,171 | 9/1979 | Narcus | 427/264 |
| 4,514,586 | 4/1985 | Waggoner | 174/35 MS |
| 4,600,609 | 7/1986 | Leever et al. | 427/438 |
| 4,770,899 | 9/1988 | Zeller | 427/96 |
| 4,997,686 | 3/1991 | Feldstein et al. | 427/443.1 |
| 5,026,616 | 6/1991 | Schumm, Jr. | 429/168 |
| 5,250,105 | 10/1993 | Gommes et al. | 106/1.11 |
| 5,269,838 | 12/1993 | Inoue et al. | 106/1.22 |
| 5,300,330 | 4/1994 | Feldstein et al. | 427/443.1 |
| 5,382,447 | 1/1995 | Kaja et al. | 427/126.6 |
| 5,403,650 | 4/1995 | Baudrand et al. | 428/209 |

OTHER PUBLICATIONS

F.A. Lowenheim, Ed., *Modern Electroplating*, Third Edition, Wiley–Interscience, New York (1974) pp. 710–731, 744, 745.

F.A. Lowenheim, *Electroplating*, McGraw–Hill, New York (1978) pp. 389–400.

*Primary Examiner*—Timothy M. Speer
*Assistant Examiner*—Bryant Young
*Attorney, Agent, or Firm*—Tiffany L. Townsend; Rockey, Milnamow & Katz

[57] ABSTRACT

A microelectronic structure, having 1) at least one metallic feature situated on a layer of material selected from the group consisting of nonmetallic and semiconductor materials; 2) a layer of a cobalt-phosphorus alloy (Co(P)) covering at least one of the at least one metallic feature; and 3) a layer of a material selected from the group consisting of nickel and palladium covering the area covered by the Co(P) layer.

21 Claims, 3 Drawing Sheets

CORROSION PROTECTION FOR METALLIC FEATURES

RELATED APPLICATIONS

This application is a continuation in part of copending U.S. Application Ser. No. 08/815,337 field Mar. 11, 1997 which is entitled "Electroless Plating of Metallic Features on Nonmetallic or Semiconductor Layer Without Extraneous Plating" now U.S. Pat. No. 5,846,598, which is a continuation of U.S. Application Ser. No. 08/565,602, filed Nov. 30, 1995, now abandoned assigned to the present assignee and which is incorporated by reference in its entirety.

TECHNICAL FIELD OF THE INVENTION

This invention pertains generally to the manufacture of a microelectronic component, such as a high density system for interconnecting integrated circuits, and particularly to the provision of corrosion protection of thin copper, cobaltcapped copper, or other metallic features present on a nonmetallic layer, such as a polyimide, ceramic, or glass layer, or on a semiconductor layer by electroless plating of such metallic features with a nickel-phosphorus alloy. This invention avoids extraneous plating in gaps no wider than about one micron.

BACKGROUND OF THE INVENTION

In high density systems for interconnecting integrated circuits, thin (e.g. 0.2 micron to 12 micron) copper or other metallic features are sandwiched between nonmetallic layers, such as polyimide layers, which are cured in situ so as to form multilayer systems. As formed on the underlying layers, the metallic features are spaced by gaps, which may be no wider than about one micron. Since the metallic features tend to corrode excessively when exposed to precursor materials for the overlying layers, particularly at high curing temperatures, to chemical solutions, or to oxidizing atmospheres, it is necessary to provide corrosion protection of the metallic features.

Electroless nickel plating and electroless cobalt plating have been considered for providing corrosion protection on such metallic layers. See Kaja et al. U.S. Pat. No. 5,382,447. See, also, Zeller U.S. Pat. No. 4,770,899. See F. Pearlstein, "Electroless Plating," which is Chapter 31 of F.A. Lowenheim, Ed., Modern Electroplating, Third Edition, Wiley-Interscience, New York (1974) at pages 710–730, for a general exposition of electroless plating.

Usually, in electroless nickel plating as known heretofore, an aqueous plating bath containing a nickel salt, such as nickel sulfate or nickel chloride, a hypophosphite, such as sodium hypophosphite, and a salt of an organic acid, such as sodium citrate or sodium acetate, is employed. Acting as a reducing agent to convert nickel to its elemental form, the hypophosphite contributes phosphorus to the plated metal, which thus is a nickel-phosphorus alloy containing a major part of nickel and a minor part of phosphorus. The salt of an organic acid acts as a buffering agent and as a mild complexing agent for nickel. Accelerating agents, which are called exaltants, may be added to the aqueous plating bath. Stabilizers and brighteners also may be added.

Although nickel-phosphorus alloys are know to be highly corrosion resistant, electroless plating as known heretofore tends to deposit such alloys too rapidly, so as to cause extraneous plating in the gaps between such metallic features. Additional processing, such as ex situ ion beam scribing, may be then necessary to remove extraneous plating from the gaps between such metallic features, particularly if the gaps are narrower than about 500 microns, so as to avert short circuiting between the plated features.

A need has existed for an improved method for providing corrosion protection of metallic features on a nonmetallic layer, such as a polyimide, ceramic, or glass layer, or on a semiconductor layer, such as a silicon layer, without needing to employ such additional processing.

SUMMARY OF THE INVENTION

It is therefore an object of the invention to provide an improved structure which provides corrosion protection of metallic features present on a nonmetallic or semiconductor layer and spaced from one another by gaps.

It is also an object of the invention to provide a structure having corrosion protection for use with thin film technology.

In accordance with the above listed and other objects, the invention discloses and claims a microelectronic structure, comprising a. at least one metallic feature situated on a layer of material selected from the group consisting of nonmetallic and semiconductor materials; (b.) a layer of a cobalt-phosphorus alloy (Co(P)) covering at least one of the at least one metallic feature; and (c.) a layer of a material selected from the group consisting of nickel and palladium covering the area covered by the Co(P) layer.

These and other objects, features, and advantages of this invention are evident from the following description of a preferred mode for carrying out this invention with reference to the accompanying drawing.

DETAILED DESCRIPTION OF THE PREFERRED MODE

Figure 1:
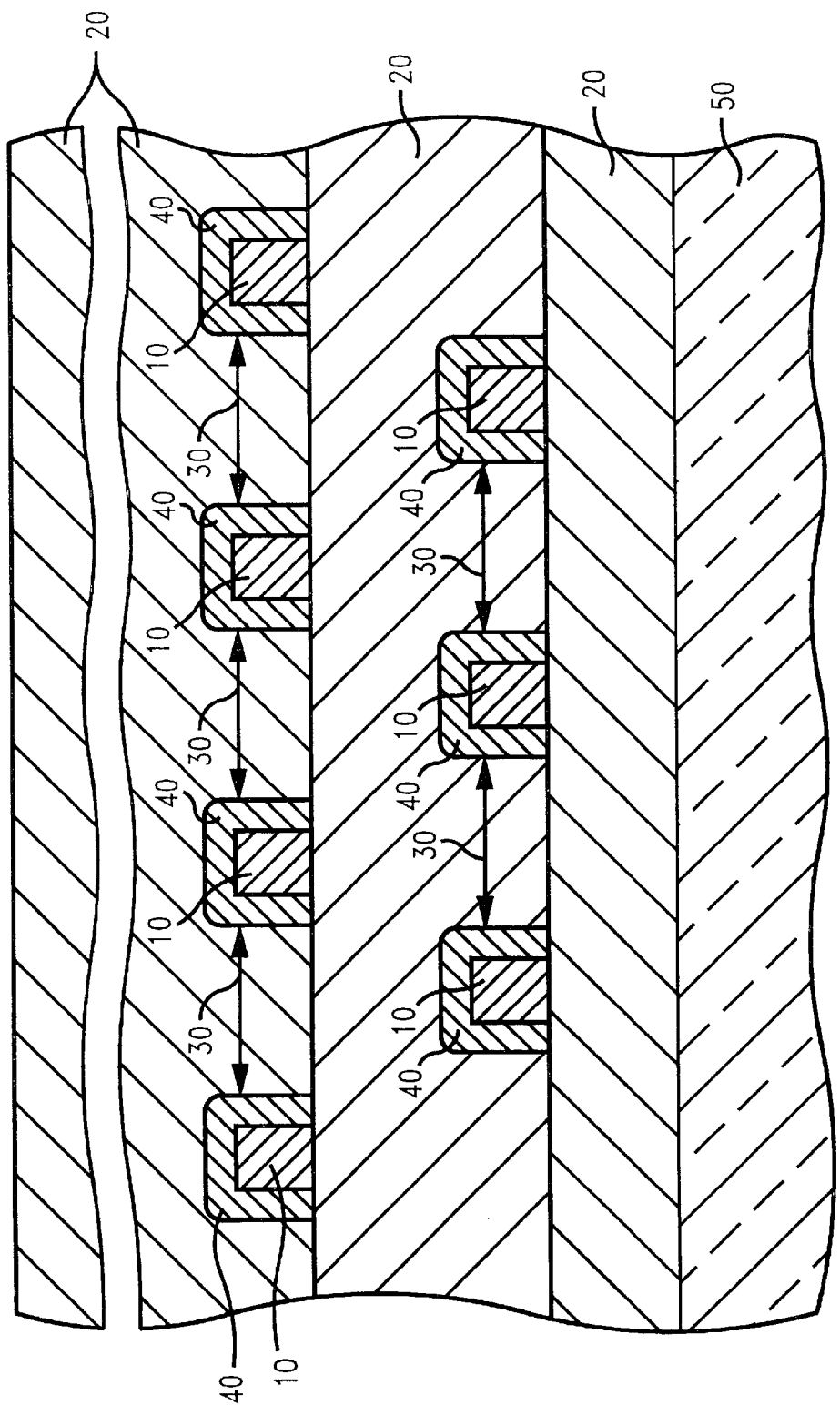
FIG. 1, which is not drawn to any scale or to true proportions, is a fragmentary, cross-sectional view of a high density system for interconnecting integrated circuits, the manufacture of which system employs the improved method provided by this invention.

Being useful in the manufacture of a microelectronic component, such as a high density, planar system for interconnecting integrated circuits, and with reference to FIG. 1, this invention provides an improved method for providing corrosion protection of copper, cobalt-capped copper, or other metallic features 10 present on a nonmetallic layer 20, such as a polyimide layer, and spaced from one another by gaps 30, at least some of which have widths of at most about 500 microns. The metallic features 10 may be conductive lines or other features. Each of the metallic features 10 may comprise plural metallic layers. As shown in FIG. 1, plural polyimide layers 20 are provided on a ceramic substrate 50, the metallic features 10 being present on the lower layers 20.

Broadly, the improved method contemplates electroless plating of the metallic features 10 with a nickel-phosphorus

[Ni(P)] alloy forming a layer 40 having a thickness in a range from about 300 Å to about 3000 Å, at a rate in a range from about 100 Å per minute to about 300 Å per minute, in an aqueous plating bath having a temperature in a range from about 65° C. to about 80° C. and a pH in a range from about 7.5 to about 8.5. The aqueous plating bath comprises low concentrations of a nickel salt, a hypophosphite, buffering and complexing agents, a decelerating agent, and a surfactant, namely the nickel salt in a range from about four grams per liter to about seven grams per liter, the hypophosphite in a range from about three grams per liter to about seven grams per liter, the buffering agent in a range from about 10 grams per liter to about 40 grams per liter, the complexing agent in a range from about 30 grams per liter to about 60 grams per liter, the decelerating agent in a range from about 0.5 part per million to about 1.5 parts per million by weight, and the surfactant in a range from about 0.05 grams per liter to about 0.2 grams per liter. This invention contemplates that the bath has a temperature in a range from about 65° C. to about 80° C. and a pH in a range from about 7.5 to about 8.5.

When the improved method is employed, the gaps 30 having widths of at least one micron remain essentially free of extraneous plating. It is unnecessary to employ additional processing, such as ex situ ion beam scribing, to remove extraneous plating from the gaps 30 having widths of at least one micron.

In the preferred mode for carrying out this invention, the layer 20 is a polyimide layer on a ceramic substrate 50. If the metallic features 10 are not catalytic for electroless nickel plating, the metallic features must be surface-activated, whereupon the polyimide layer 20 where exposed in the gaps 30 between the metallic features may need to be selectively deactivated. Suitable surface-activating and selective deactivating methods are disclosed in Kaja et al. U.S. Pat. No. 5,382,447, the disclosure of which is incorporated herein by reference. Other surface-activating and selective deactivating methods may be alternatively suitable.

In the aqueous plating bath used in the preferred mode for carrying out this invention, the nickel salt is nickel sulphate hexahydrate in an amount of about 5.5 grams per liter. Acting as a reducing agent to convert nickel to its elemental form, the hypophosphite is sodium hypophosphite in an amount of about six grams per liter. The buffering agent is boric acid in an amount of about 30 grams per liter. The complexing agent is sodium citrate in an amount of about 45 grams per liter. It is important to use buffering and complexing agent, such as boric acid and sodium citrate, which do not leave deleterious byproducts. A decelerating agent is used, which prevents plating from occurring too rapidly, and which thus helps to prevent extraneous plating in the gaps between the plated features. It has been found that lead acetate or lead sulphite is suitable as a decelerating agent, lead acetate being preferred in an amount of about one part per million by weight of lead. As the surfactant, Fluorad™ FC-98 surfactant (type: anionic; chemical description: potassium perfluoroalkyl sulfonates) which is available commercially from Minnesota Mining and Manufacturing Company, Industrial Chemical Products Division, St. Paul, Minn., in an amount of about 0.1 grams per liter is suitable. Other surfactants may be alternatively useful. The aqueous plating bath has a temperature of about 72° C. and a pH of about 8.1.

When the metallic features 20 present on the polyimide layer and spaced as noted above are subjected to electroless plating in the aqueous plating bath described in the preceding paragraph, the layer 40 of the nickel-phosphorus [Ni(P)] alloy is deposited on the metallic features so as to reach a thickness in a range from about 200 Å to about 3000 Å, at a rate of about 100 Å per minute. After the layer 40 reaches such a thickness, the polyimide layer 20 with the plated features 10 is removed from the aqueous plating bath and is rinsed. Although the layer 40 covers side walls of the plated features 10 so as to narrow the gaps 30 by about twice the thickness of the layer 40, the layer 40 does not cause extraneous plating or metallic bridging within the gaps 30 having widths of at least one micron. Nickel oxide forms superficially on the plated layer 40 and contributes to corrosion protection. Phosphorus in the plated layer 40 also contributes to corrosion protection.

In a first example, a nickel-phosphorus [Ni(P)] layer having a thickness of at least 500 Å was plated by the preferred mode described above on metallic features present on a polyimide layer and comprised of a chromium layer contacting the polyimide layer and having a thickness of about 200 Å, a copper layer covering the chromium layer and having a thickness of about 4.5 microns, and a layer of a cobalt-phosphorus [Co(P)] alloy covering the copper layer and having a thickness in a range of about 500 Å to about 1000 Å. The nickel-phosphorus layer was plated on the layer of the cobalt-phosphorus alloy. No additional processing, such as ex situ ion beam scribing, was employed to remove extraneous plating from the gaps. No extraneous plating was observed in the gaps. After five simulated polyimide curing cycles, no preferential diffusion of nickel into copper was observed, and the resistivity of the copper layer remained within experimental error.

Figure 2:
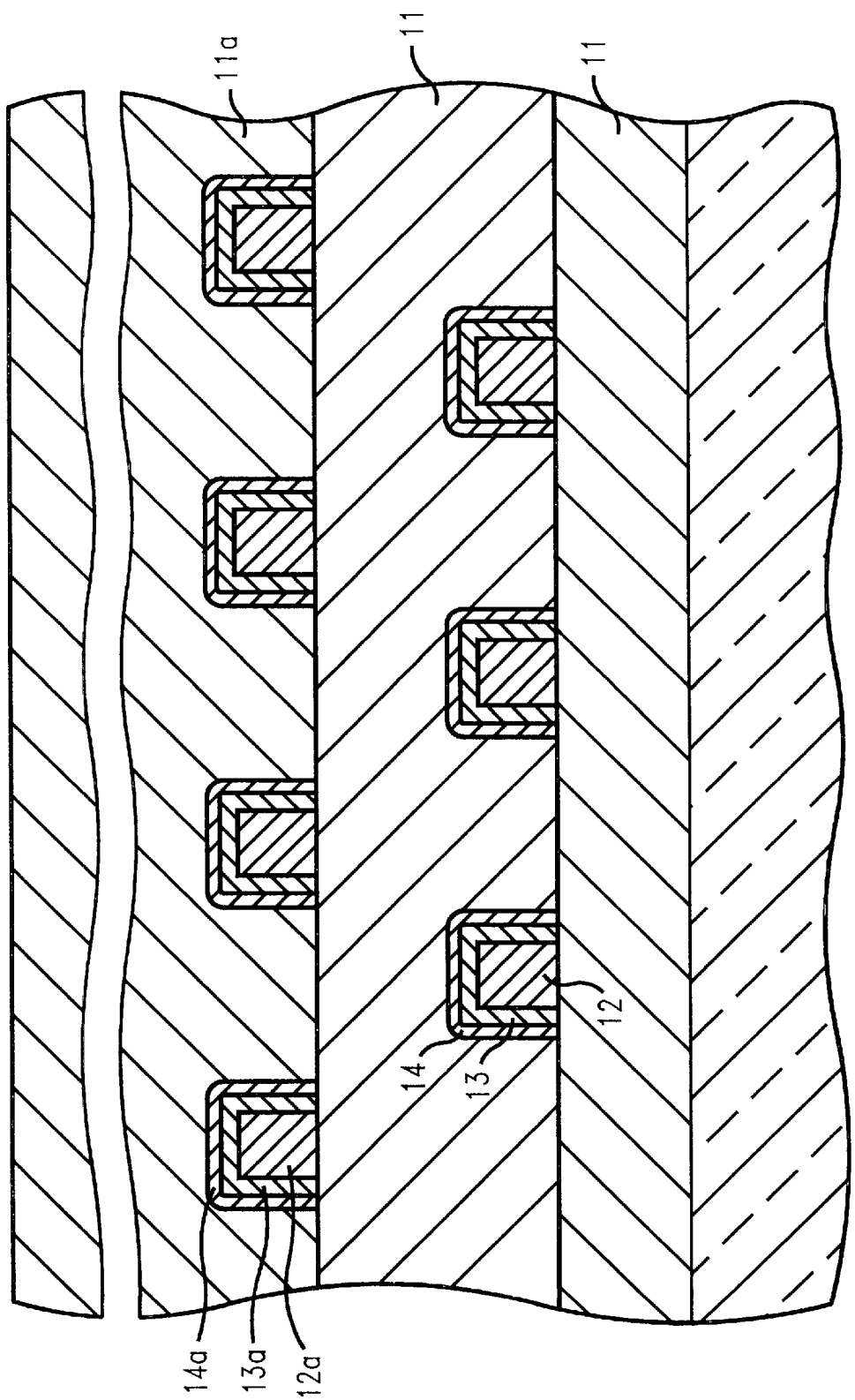
FIG. 2, which is not drawn to any scale or to true proportions, is a fragmentary, cross-sectional view of an alternative high density system for interconnecting integrated circuits, the manufacture of which system employs the improved method provided by this invention.

FIG. 2 shows the structure obtained by the example shown previously. Metallic features, 12 and 12a are disposed on nonmetallic or semiconductive material, 11 and 11a. A layer of a diffusion barrier, 13 and 13a, is deposited on each layer of the metallic features, 12 and 12a. A layer of a corrosion protection material, 14 and 14a, is then deposited on each of the previously deposited diffusion barrier layers. The metal features, 12a, may be in electrical communication with the metal features, 12. If there is more than one metallic feature on the nonmetallic or semiconductive material, 11, then at least some of the adjacent features must be at least 1 micron apart. In a preferred embodiment, the adjacent features would be at most about 500 microns apart.

Figure 3:
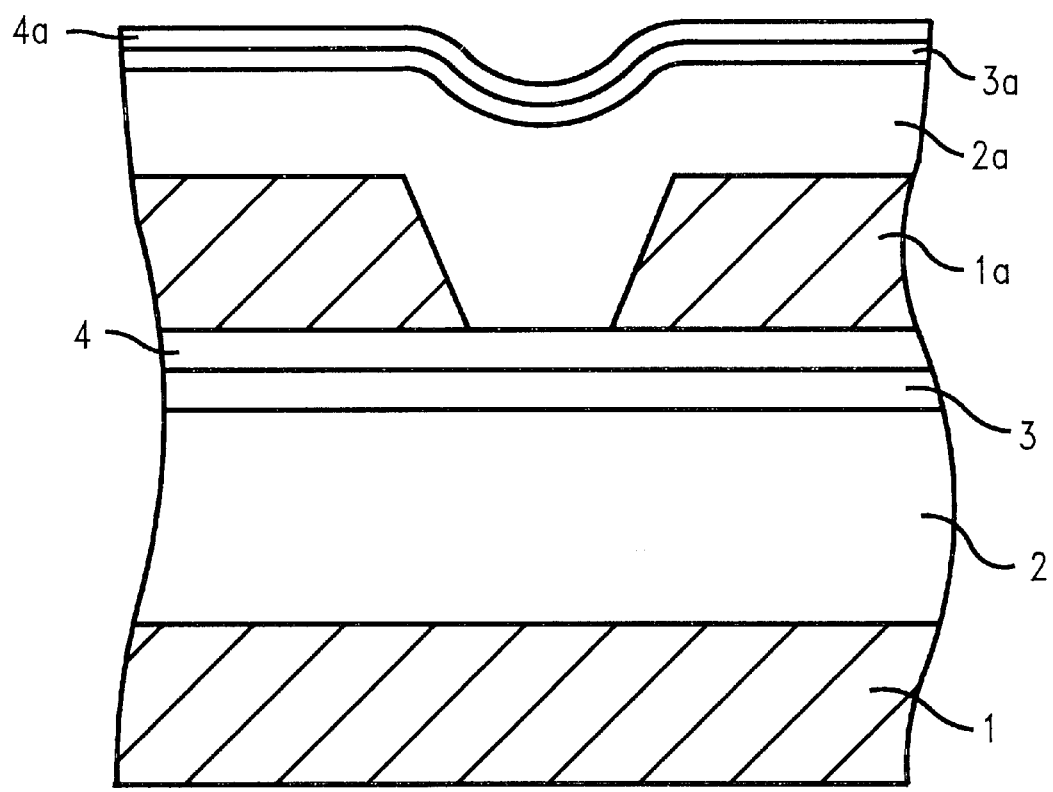
FIG. 3, which is not drawn to any scale or to true proportions, is a fragmentary, cross-sectional view of yet another high density system for interconnecting integrated circuits, the manufacture of which system employs the improved method provided by this invention.

FIG. 3 shows an alternative structure that can be formed by the present invention. FIG. 3 shows an embodiment useful in thin film technology. Metallic feature, 2, is disposed on at least a portion of dielectric layer, 1. A diffusion barrier layer, 3, acts as a capping layer and covers at least the portion of the preceding layer covered by the conductor, 2. A corrosion protection layer, 4, covers at least the portion of the preceding layer covered by the diffusion barrier layer, 3.

Optionally, as shown in FIG. 3, a second metallic feature 2a, could be disposed on a second layer of at least a portion of a second dielectric layer, 1a, such that the second metallic feature, 2a, is in electrical communication with the diffusion barrier layer, 3. A second diffusion barrier layer, 3a, would cover the second metallic feature, 2a. A second corrosion protection layer, 4a, would cover the second barrier layer, 3a. In all cases, if more than one metallic feature is present after the final coating then at least some of the adjacent metallic features would be at most about 500 microns apart. The metallic features, 2a, may be in electrical communication with the metallic features, 2.

The same materials can be used for either of the structures shown in FIGS. 2 and 3. Examples of materials that could be used as the corrosion protection layer include Ni(P), Ni(B), Pd(P), alloys of Ni(X)(P), alloys of Ni(X)(B), and alloys of Pd(X)(P), where the (X) represents an alloy comprising of a single component, like Sn, or multiple components, like (W)(Sn). The corrosion protection layer could therefore be comprised of Ni(Sn)(P) or Ni(W)(Sn)(P). (X) should have at least one member from the group consisting of tungsten (W), molybdenum (Mo), Cobalt (Co), rhenium (Re), tin (Sn), germanium (Ge), and palladium,(Pd).

In a preferred embodiment the conductor would be copper and the diffusion barrier layer would be Co(P). Also in a preferred embodiment, the corrosion protection layer would be comprised of at least one of the following: Ni(P), Ni(B), Pd(P), Ni(W)(P), Ni(Mo)(P), Ni(Co)(P), Ni(Re)(P), Ni(Sn)(P), Ni(Ge)(P), Ni(Pd)(P), Ni(W)(B), Ni(Mo)(B), Ni(Co)(B), Ni(Re)(B), Ni(Sn)(B), Ni(Ge)(B), Ni(Pd(B), Pd(W)(P), Pd(Mo)(P), Pd(Co)(P), Pd(Re)(P), Pd(Sn)(P), and Pd(Ge)(P). Further, in the preferred embodiment, the diffusion barrier layer would be at least about 500 Å and at most about 1000 Å thick, the corrosion protection barrier would be at least about 500 Å thick.

In a more preferred embodiment the corrosion protection layer would be comprised of Ni(P), Ni(B), Pd(P), Ni(W)(P), Ni(Mo)(P), Ni(Co)(P), Ni(Re)(P), Ni(Sn)(P), Ni(Ge)(P), Ni(Pd)(P), Ni(W)(B), Ni(Mo)(B), Ni(Co)(B), Ni(Re)(B), Ni(Sn)(B), Ni(Ge)(B) and Ni(Pd(B). In an even more preferred embodiment the corrosion protection layer would be comprised of Ni(P), Ni(B), Pd(P), Ni(W)(P), Ni(Mo)(P), Ni(Co)(P), Ni(Re)(P), Ni(Sn)(P), Ni(Ge)(P) and Ni(Pd)(P). In a most preferred embodiment, the corrosion protection layer would be Ni (P)

Although the preferred mode describe above provides corrosion protection of copper, cobalt, or other metallic features present on a polyimide layer and spaced from one another by gaps, at least some of which have widths in the range specified above, the improved method provided by this invention is expected to be similarly useful for providing corrosion protection of such metallic features present and spaced similarly on another nonmetallic layer, such as another polymeric layer or a ceramic layer, or on a semiconductor layer, such as a silicon layer.

Although a preferred mode for carrying out this invention in the manufacture of a planar system for interconnecting integrated circuits has been described, this invention is useful also in the manufacture of other microelectronic components, which include but are not limited to non-planar systems for interconnecting integrated circuits.

Various modifications may be made in the preferred mode described above without departing from the scope and spirit of this invention.

What is claimed is:

1. A microelectronic structure, comprising:
   at least one metallic feature situated on a layer of material selected from the group consisting of nonmetallic and semiconductor materials;
   a layer of a cobalt-phosphorus alloy (Co(P)) covering at least one of the at least one metallic feature; and
   a layer of a material selected from the group consisting of nickel and palladium covering the area covered by the Co(P) layer, wherein the material covering the Co(P) layer is selected from the group consisting of Ni(P), Ni(B), Pd(P), Ni(X)(P),Ni(X)(B) and Pd(X)(P), where (X) is an alloy comprising at least one of W, Mo, Co, Re, Sn, Ge, or Pd.

2. A microelectronic structure, comprising:
   at least one metallic feature situated on a layer of material selected from the group consisting of nonmetallic and semiconductor materials;
   a layer of a cobalt-phosphorus alloy (Co(P)) covering at least one of the at least one metallic feature; and
   a layer of a material selected from the group consisting of nickel and palladium covering the area covered by the Co(P) layer, wherein there are at least two metallic features and wherein the distance between each of the features is at most about 500 microns.

3. The structure according to claim 2, wherein the material covering the Co(P) is Ni(P).

4. The structure according to claim 1 wherein the at least one metallic feature comprises copper.

5. The structure according to claim 2 wherein all of the at least two metallic features comprise copper.

6. A microelectronic structure, comprising:
   at least one metallic feature situated on a layer of material selected from the group consisting of nonmetallic and semiconductor materials;
   a layer of a cobalt-posphorus alloy (Co(P)) covering at least one of the at least one metallic feature; and
   a layer of a material selected from the group consisting of nickel and palladium covering the area covered by the Co(P) layer, wherein the material covering the Co(P) layer is at least about 500 Å thick and the material covering the metallic feature is at least about 500 Å and at most about 1000 Å.

7. A thin film microelectronic structure, comprising:
   at least one first metallic feature;
   a first layer of a cobalt-phosphorus alloy (Co(P)) covering at least one of the at least one first metallic feature;
   a first layer of a material selected from the group consisting of nickel and palladium covering the area covered by the first Co(P) layer;
   a layer of a dielectric material covering the area covered by the layer comprising the material selected from the group consisting of nickel and palladium;
   a copper feature in electrical communication with the layer comprising the material selected from the group consisting of nickel and palladium.

8. The structure according to claim 7 further comprising a second layer of a Co(P) covering at least one of the at least one second metallic feature; and a second layer of a material selected from the group consisting of nickel alloys and palladium alloys, wherein the material covers the area covered by the second Co(P) layer.

9. The structure according to claim 7, wherein the material covering the first Co(P) layer is selected from the group consisting of Ni(P), Ni(B), Pd(P), Ni(X)(P), Ni(X)(B) and Pd(X)(P), where (X) is an alloy comprising at least one of W, Mo, Co, Re, Sn, Ge, or Pd.

10. The structure according to claim 8, wherein the material covering the first and second Co(P) layers is selected from the group consisting of Ni(P), Ni(B), Pd(P), Ni(X)(P),Ni(X)(B) and Pd(X)(P), where (X) is an alloy comprising at least one of W, Mo, Co, Re, Sn, Ge, or Pd.

11. The structure according to claim 7 wherein the first and second metallic features are comprised of copper.

12. The structure according to claim 7 wherein there are at least two first metallic features and the distance between the two is at least one micron.

13. The structure according to claim 9 wherein the material covering the first Co(P) layer is Ni(P).

14. The structure according to claim 10 wherein the material covering the first and second Co(P) layers is Ni(P).

15. The structure according to claim 7 wherein the material covering the first Co(P) layer is at least about 500 Å and thick and the material covering the first metallic feature is at least about 500 Å and at most about 1000 Å.

16. The structure according to claim 8 wherein the material covering the first and second Co(P) layers is at least about 500 Å thick and the material covering the first and second metallic features is at least about 500 Å and at most about 1000 Å.

17. A microelectronic structure, comprising:
- at least one first metallic feature situated on a first layer of a material selected from the group consisting of nonmetallic and semiconductor materials;
- a first layer of a cobalt-phosphorus alloy (Co(P)) covering at least one of the at least one first metallic feature; and
- a first layer of a first material selected from the group consisting of nickel and palladium covering the area covered by the first Co(P) layer;
- at least one second metallic feature situated on a second layer of material selected from the group consisting of nonmetallic and semiconductor materials;
- a second layer of Co(P), covering at least one of the at least one second metallic feature; and
- a second layer of a material selected from the group consisting of nickel and palladium covering the area covered by the second Co(P) layer; and
- wherein the first metallic feature is in electrical communication with the second metallic feature, wherein the material covering the Co(P) layer is selected from the group consisting of Ni(P), Ni(B), Pd(P), Ni(X)(P), Ni(X)(B) and Pd(X)(P), where (X) is an alloy comprising at least one of W, Mo, Co, Re, Sn, Ge, or Pd.

18. A microelectronic structure, comprising: at least one first metallic feature situated on a first layer of a material selected from the group consisting of nonmetallic and semiconductor materials;
- a first layer of a cobalt-phosphorus alloy (Co(P)) covering at least one of the at least one first metallic feature; and
- a first layer of a first material selected from the group consisting of nickel and palladium covering the area covered by the first Co(P) layer;
- at least one second metallic feature situated on a second layer of material selected from the group consisting of nonmetallic and semiconductor materials;
- a second layer of Co(P), covering at least one of the at least one second metallic feature; and
- a second layer of a material selected from the group consisting of nickel and palladium covering the area covered by the second Co(P) layer; and
- wherein the first metallic feature is in electrical communication with the second metallic feature, wherein there are at least two metallic features on each of the first and second layers comprising material selected from the group consisting of nonmetallic and semiconductor materials and wherein the distance between each of the features on each of the first and second layers is at most about 500 microns.

19. The structure according to claim 17, wherein the first and second metal features are comprised of copper.

20. The structure according to claim 17 wherein the material covering the first and second Co(P) layers is Ni(P).

21. A microelectronic structure, comprising:
- at least one first metallic feature situated on a first layer of a material selected from the group consisting of nonmetallic and semiconductor materials;
- a first layer of a cobalt-phoshorus alloy (Co(P)) covering at least one of the at least one first metallic feature; and
- a first layer of a first material selected from the group consisting of nickel and palladium covering the area covered by the first Co(P) layer;
- at least one second metallic feature situated on a second layer of material selected from the group consisting of nonmetallic and semiconductor materials;
- a second layer of Co(P), covering at least one of the at least one second metallic feature; and
- a second layer of a material selected from the group consisting of nickel and palladium covering the area covered by the second Co(P) layer; and
- wherein the first metallic feature is in electrical communication with the second metallic feature, wherein the material covering the first and second Co(P) layers is at least about 500 Å and at most about 2000 Å thick and the material covering the first and second metallic features is at least about 500 Å and at most about 1000 Å.

* * * * *